(12) United States Patent
Gross et al.

(10) Patent No.: US 10,564,230 B2
(45) Date of Patent: Feb. 18, 2020

(54) TEMPERATURE COMPENSATED NMR MAGNETIC FIELD PROBES

(71) Applicants: Eidgenossische Technische Hochschule (ETH), Zurich (CH); Universitat Zurich, Zurich (CH)

(72) Inventors: Simon Gross, Zurich (CH); Christoph Barmet, Zurich (CH)

(73) Assignees: Eidgenossische Technische Hochschule (ETH) (CH); Universitat Zurich (CH)

( * ) Notice: Subject to any disclaimer, the term of this patent is extended or adjusted under 35 U.S.C. 154(b) by 0 days.

(21) Appl. No.: 15/573,886

(22) PCT Filed: May 16, 2016

(86) PCT No.: PCT/EP2016/006049
§ 371 (c)(1),
(2) Date: Nov. 14, 2017

(87) PCT Pub. No.: WO2016/184830
PCT Pub. Date: Nov. 24, 2016

(65) Prior Publication Data
US 2018/0321335 A1    Nov. 8, 2018

(30) Foreign Application Priority Data

May 15, 2015 (EP) ...................................... 15167912

(51) Int. Cl.
| | | |
|---|---|---|
| G01R 33/24 | (2006.01) | |
| G01R 33/565 | (2006.01) | |
| G01R 33/58 | (2006.01) | |

(52) U.S. Cl.
CPC ....... *G01R 33/24* (2013.01); *G01R 33/56563* (2013.01); *G01R 33/58* (2013.01)

(58) Field of Classification Search
CPC ... G01R 33/24; G01R 33/56563; G01R 33/58
See application file for complete search history.

(56) References Cited

U.S. PATENT DOCUMENTS

2009/0295389 A1* 12/2009 Pruessmann ........... G01R 33/24
324/318

FOREIGN PATENT DOCUMENTS

| EP | 1582886 A1 | 10/2005 |
|---|---|---|
| WO | 2007118715 A1 | 10/2007 |

(Continued)

OTHER PUBLICATIONS

Zanche et al., NMR Probes for Measuring Magnetic Fields and Field Dynamics in MR Systems, Magnetic Resonance in Medicine 60:176-186, 2008 (Year: 2008).*

(Continued)

*Primary Examiner* — Daniel R Miller
(74) *Attorney, Agent, or Firm* — George Pappas (57) ABSTRACT

A magnetic field probe, particularly for magnetic resonance applications, comprises: —a detector liquid that exhibits a nuclear magnetic resonance (NMR) line characterized by a chemical shift δ; —an electrically conductive structure surrounding the detector liquid for receiving therefrom a magnetic resonance signal; and —a container containing the detector liquid; —the detector liquid containing paramagnetic dopant means dissolved therein; —said NMR transition having an observable resonance frequency ω when the field probe is placed in an external magnetic field; and has orientation means for orienting the field probe in relation to a reference direction of said external magnetic field. The concentration $c_D$ of said paramagnetic dopant means is selected in such manner that, when the field probe is placed into an external magnetic field $B_0$ and oriented in a predefined manner with respect to said external magnetic field at a given temperature $T_0$, a temperature dependence $\omega'(T_0)$ of said resonance frequency is substantially zero.

20 Claims, 3 Drawing Sheets

(56) References Cited

FOREIGN PATENT DOCUMENTS

| WO | WO 2007118715 A1 | 10/2007 |
|---|---|---|
| WO | 2012143574 A1 | 10/2012 |
| WO | WO 2012143574 A1 | 10/2012 |

OTHER PUBLICATIONS

Gross, S., Sub-ppb/K temperature drift of NMR field probes using intrinsic magnetostatic compensation; Proceedings of the International Society for Magentic Resonance in Medicine, ISMRM, 23rd Annual Meeting and Exhibition, Toronto, Ontario, Canada, 2015, 1838.
Wilm, B.J., Concurrent highr-order field monitoring eliminates thermal drifts in parallel DW1; Proceedings of the International Society for Magentic Resonance in Medicine, ISMRM, 18th Scientific Meeting and Exhibition, Stockholm, Sweden, 2010, 190.
Ishihara, Y et al., A Precise and Fast Temperature Mapping Using Water Proton Chemical Shift; Magentic Resonance in Medicine 1995, 34, 6, 814-823.
Rudra N., et al., Determination of sample temperature in unstable static fields by combining solidstate 79Br and 13C NMR; Journal of Magnetic Resonance 2014, 246, 69.71.
Baker, W.J., et al., Robust absolute magnetometry with organic thin-film devices; Nature Communications 2012, 3, 1-7.
DeZanche N., et al., NMR probes for magnetic field monitoring during MRI; Proceedings 13th Scientific Meeting, International Society for Magnetic Resonance in Medicine, Miami Beach, Florida, USA, 2005, 791.
Massin C. et al., Planar microcoil-based microfluidic NMR probes; Journal of Magnetic Resonance 2003, 164, 242-255.
Davis, R.S., Equation for the volume magnetic susceptibility of moist air, Metrologia 1998, 35, 49-55.
Hindman, J.C., Proton Resonance Shift of Water in the Gas and Liquid States, The Journal of Chemical Physics 1966, 44, 4582-4592.
Chu, K.C., et al., Bulk Magnetic Susceptibility Shifts in NMR Studies of Compart-mentalized Samples: Use of Paramagnetic Reagents, Magnetic Resonance in Medicine 1990, 13, 239-262.
Vlassenbroek, A. et al.; Macroscopic and Microscopic Fields in High-Resolution Liquid NMR, Journal of Magnetic Resonance, Series A 1996, 118, 234-246.
Marques, J. & Bowtell, R., Application of a Fourier-Based Method for Rapid Calculation of Field Inhomogeneity Due to Spatial Variation of Magnetic Susceptibility, Concepts in Magnetic Resonance Part B: Magnetic Resonance Engineering 2005, 25B, 65-78.
International Search Report in related PCT/EP2016/060949.
Written Opinion of the International Searching Authority in related PCT/EP2016/060949.

* cited by examiner

TEMPERATURE COMPENSATED NMR MAGNETIC FIELD PROBES

This application claims priority from PCT application No. PCT/EP2016/060949 filed May 16, 2016 which claims priory from European application No. EP 15167912.3 filed on May 15, 2015, the disclosures of which are incorporated herein by reference.

FIELD OF THE INVENTION

The present invention generally relates to magnetic field probes, particularly for use in magnetic resonance (MR) spectroscopy and imaging applications.

BACKGROUND OF THE INVENTION

Despite continued advances in magnetic resonance (MR) instrumentation, imperfections in the magnetic field evolution still hamper numerous MR procedures. Field perturbations are caused by a range of mechanisms, including eddy currents, limited gradient bandwidth, and heating effects. Often such errors can be addressed by means of signal processing. However, to do so these errors need to be accurately known. Reproducible field perturbations can be determined approximately by preparatory measurements. Alternatively, it has been proposed to monitor the relevant field evolution directly during each actual scan, using appropriately designed magnetic field probes.

EP 1 582 886 A1 discloses a method of MR imaging wherein additional data are acquired, during execution of a MR sequence, from at least one monitoring magnetic field probe positioned in the vicinity of or surrounding an object of interest. The magnetic field probes exploit the presence of a strong magnetic field needed for the MR measurements; accordingly, they are based upon magnetic resonance in a small sample volume of an MR active substance. Upon MR excitation of the object of interest, there is a concomitant MR excitation of the substance within the probe, the resonance frequency of which is proportional to the magnitude of the local magnetic field.

As discussed in EP 1582886 A1, magnetic resonance in the probe sample can be based on nuclear magnetic resonance (NMR), in which case the probe sample shall contain a NMR active nuclear species such as $^1H$, $^{13}C$, $^{17}O$, $^{19}F$ or $^{31}P$. Magnetic resonance imaging (MRI) is mostly based on $^1H$. As is well known, the choice of the nucleus for probing is subject to several considerations, and, based on the chosen nucleus, the choice of the substance used as the sample in a magnetic field probe is also subject to several considerations. According to EP 1582886 A1, normal water ($^1H_2O$) is a preferred probe substance based on $^1H$ whereas suitable substances based on $^{19}F$ include hexafluorobenzene and trifluoromethlysulfonate. It is also mentioned in EP 1582886 A1 to add suitable relaxation agents so as to modify relaxation times in the sample as needed.

An improved NMR-based magnetic field probe has been described in De Zanche N, Barmet C, Meier D, Pruessmann K. *NMR probes for magnetic field monitoring during MRI.* Proceedings 13th Scientific Meeting, International Society for Magnetic Resonance in Medicine; 2005, May, p 791.

Magnetic field monitoring with nuclear magnetic resonance (NMR) based field probes is also a powerful tool for hardware and sequence development, and quality assurance in MRI as well as for monitoring magnetic fields in general. During the measurements, the temperature of the NMR field probe can vary due to different effects (e.g., change in ambient conditions, radiative or conductive heating and cooling), potentially leading to inaccurate measurement values.

SUMMARY OF THE INVENTION

It is thus an object of the present invention to provide an improved magnetic field probe. In particular, the magnetic field probe shall be suited for magnetic resonance applications and it shall overcome the disadvantages of currently known probes. Even more particularly, the magnetic field probe shall have a substantially smaller temperature dependence than presently known probes.

According to the invention, there is provided a magnetic field probe comprising:
- a detector liquid that exhibits a nuclear magnetic resonance (NMR) line characterized by a chemical shift δ;
- an electrically conductive structure surrounding a detection region of the detector liquid for receiving therefrom a magnetic resonance signal; and
- a container containing the detector liquid;
- the detector liquid containing paramagnetic dopant means dissolved therein;
- said NMR line having an observable resonance frequency ω when the field probe is placed in an external magnetic field;
- the field probe having orientation means for orienting the field probe in relation to a reference direction of said external magnetic field.

According to the invention, the concentration $c_D$ of said paramagnetic dopant means is selected in such manner that, when the field probe is placed into an external magnetic field $B_0$ and oriented in a predefined manner with respect to said external magnetic field at a given temperature $T_0$, a temperature dependence $\omega'(T_0)$ of said resonance frequency ω defined as $$\omega'(T_0) := \frac{\partial \omega}{\partial T}(T_0) = \gamma B_0 (\Sigma_i \; n_i \; \chi'_i(T_0) + D'_{d\chi d}(T_0) + \delta'(T_0)) \quad (1)$$

wherein:
- γ ist the gyromagnetic ratio of the nucleus giving rise to said NMR line;
- i denotes any magnetized component of the probe, excluding the detector liquid;
- $n_i$ is the relative field factor of the microscopic magnetic field at the position of the detection region produced by the magnetized component i;
- $\chi'_i(T_0)$ is the temperature dependence of the volume susceptibility of component i at temperature $T_0$;
- $D_d$ is the relative field factor of the microscopic magnetic field at the position of the detection region produced by the magnetized detector liquid;
- $\chi'_d(T_0)$ is the total temperature dependence of the volume susceptibility of the detector liquid including dopant means at temperature $T_0$; and
- $\delta'(T_0)$ is the temperature dependence of the total chemical shift of the nuclear magnetic resonance under study at temperature $T_0$ is substantially zero.

It will be noted from the above that derivatives with respect to temperature will generally be denoted by a prime. For example, the notation $\omega'(T_0)$ stands for the derivative of w with respect to temperature, taken at the temperature $T_0$.

As will be explained further below, the term "paramagnetic dopant means" shall be understood as either a single paramagnetic substance or as a mixture of paramagnetic substances. While such paramagnetic substances may be selected from a broad range, it will generally be necessary to avoid mixing any substances that could give rise to undesirable chemical reactions or other unwanted phenomena such as formation of precipitate In order to ensure the chemical stability of the solution formed by the detector liquid and paramagnetic dopant means dissolved therein, it might be useful to add one or several other substances (stabilizing compound(s)). For example, adjusting the pH-value by adding an acidic or basic substance or by adding a substance acting as a buffer can prevent issues with precipitation of involved salts.

It should be noted that the addition of such stabilizing substance can have an effect on the relaxivity and the magnetic susceptibility of the solution, as well as the temperature dependence thereof. These effects have to be taken into account in the computation of the temperature dependence of the resonance frequency.

The expression "detection region" shall be understood as a volume region of the detector liquid that is surrounded by the above mentioned electrically conductive structure and thus is the volume region of the field probe where the NMR is measured.

The expression "substantially zero" shall be understood in the following sense: Although it is possible to calculate the concentration $c_D$ of the paramagnetic dopant means needed to obtain a zero value of the temperature derivative of the resonance frequency up to an arbitrary numerical accuracy, there will be an inevitable inaccuracy in the actual substance dosage required to achieve the calculated concentration. Moreover, there will be inevitable inaccuracies in the values of various quantities appearing in the above formula (1). This means that the required condition of $\omega'(T_0)=0$ cannot be generally met in the strict mathematical sense.

An enabling description on how the determination of $c_D$ is carried out in the sense of the present invention is given in the section entitled "Theory".

It should be pointed out that formula (1) is not an exact description of $\omega'(T_0)$ but rather a linear approximation using a description which is first order in T and $\chi$. Nevertheless, provision of a magnetic field probe having a resonance frequency that is substantially temperature independent at a pre-selected operating temperature $T_0$ has many advantages. By carefully identifying, quantifying and eventually manipulating the effects that contribute to the temperature dependence, it is possible to play them off against each other and to come up with a magnetic field probe whose temperature dependent frequency shift is reduced by more than an order of magnitude in comparison with known designs, e.g. from 11 ppb/K to below 0.1 ppb/K for water-based NMR probes, increasing the stability of the field monitoring substantially.

As will be understood from the theory section, the compensation of temperature dependent terms leading to cancellation of $\omega'(T_0)$ will, in general, be dependent on the orientation of the magnetic field probe, i.e. of the essential components forming it, in relation to the external magnetic field $B_0$. The underlying relationships are contained in the above mentioned relative field factors. In other words, the desirable effect will generally be achieved only for a specific orientation. Accordingly, it is necessary to provide the magnetic field probe with suitable "orientation means", which shall be understood to mean any features that are suitable for orienting the magnetic field probe in a defined manner in relation to a reference direction of the external magnetic field. In most cases the reference direction will simply coincide with a nominal direction of the magnetic field. In the simplest case the orientation means are simple alignment marks provided on a component of the field probe, but they could also be any mechanical attachment devices for engagement in a suitable counterpart provided on an instrument that is by itself in a defined relationship with the magnetic field direction, most notably a part of a MR apparatus.

Advantageous embodiments are defined in the description below.

As just mentioned, in the most general cases $\omega'(T_0)$ will be substantially zero only when the field probe is oriented in one predefined manner with respect to said external magnetic field. However, configurations with a higher symmetry may be established by judicious selection of the shapes and materials of the various components of the magnetic field probe. Therefore, according to an advantageous embodiment $\omega'(T_0)$ is substantially zero when the field probe is oriented in a further predefined manner with respect to said external magnetic field. In some highly symmetric situations $\omega'(T_0)$ is substantially zero independently of the orientation with respect to said external magnetic field.

In principle, the paramagnetic dopant means could be any paramagnetic substance that can be incorporated in the detector liquid. According to an advantageous embodiment, the paramagnetic dopant means consists of at least one paramagnetic ion species. Use of just one paramagnetic ion species has the advantages of a simpler calculation of the necessary dopant concentration. Inclusion of two or even more paramagnetic ion species will make the calculation of the necessary concentrations more complicated, but it offers greater flexibility in meeting any further requirements to be fulfilled by the magnetic field probe. An example for such a requirement is the relaxation time of the magnetic field probe, which determines signal levels and also useful measurement time windows. Magnetic field probes based on NMR excitation take advantage from detector liquids having a high density of chemically equivalent NMR-active nuclei. This requirement is met e.g. by cyclohexane (when using $^1H$ resonance) and by hexafluorobenzene (when using $^{19}F$ resonance). According to another embodiment for using $^1H$ resonance, the detector liquid is water.

While compounds of $Cu^{2+}$, $Mn^{2+}$, $Cr^{3+}$, $Fe^{3+}$ and $Gd^{3+}$ are commonly used as relaxation agents in NMR based magnetic field probes, the concentrations required for achieving a substantially vanishing $\omega'(T_0)$ could lead to short relaxation times. Further relaxation agents that may be used are $Ho^{3+}$, $Tb^{3+}$, $Er^{3+}$, $Tm^{3+}$, $Yb^{3+}$, $Eu^{3+}$, $Pr^{3+}$.

According to an advantageous embodiment, the paramagnetic dopant means are $Dy^{3+}$ ions.

According to an advantageous embodiment, the paramagnetic dopant means are $Nd^{3+}$ ions.

In one implementation small amounts of HCl were admixed to stabilize an aqueous solution of $NdCl_3$ and $CuCl_2$.

According to yet another embodiment, the paramagnetic dopant means comprise at least two paramagnetic dopant species. By selecting two species with different relaxation properties and susceptibility, it is possible to achieve the desired temperature compensation while also adapting the relaxation within a range provided by the selection of the dopant species.

It is known that the magnetic field induced by a homogeneous external magnetic field within ellipsoidal objects of homogeneous magnetic susceptibility is again homogeneous (see e.g. Massin, C. et al., Journal of Magnetic Resonance; 164 (2003) pp. 242-255). Therefore, according to a favorable embodiment, the container has ellipsoidal geometry, which includes the special case of spheroidal geometry, and is approximated by an elongate cylindrical geometry.

According to a particularly favorable embodiment, the magnetic field probe further comprises a solid jacket encasing the detector liquid and the conductive structure, the solid jacket being made of a hardened two-component epoxy system containing a paramagnetic agent dissolved therein, the concentration $c_A$ of the paramagnetic agent being chosen such that the jacket has a magnetic susceptibility that is substantially identical to the magnetic susceptibility of the conductive structure. Such magnetic field probes have been described in WO 2007/118715 A1.

According to a further embodiment, the magnetic field probe further comprises means for pulsed excitation of said NMR transition and means for receiving a corresponding NMR signal induced by said pulsed excitation. Magnetic field probes configured in this manner are particularly suitable as probe units for installation, e.g. into a dynamic field camera as disclosed in WO 2012/143574 A1.

Theory

In a simple model the precession frequency ω of a spin in the detector liquid can be described as follows (up to first order in χ and δ):

$$\omega = \gamma B_0 \left(1 + \sum_i n_i \chi_i + D_d \chi_d + \delta \right)$$

wherein:
δ total chemical shift of the observed NMR line (dimensionless)
γ gyromagnetic ratio of the MR nucleus under study (units: rad s$^{-1}$ T$^{-1}$)
$B_0$ applied magnetic field (units: T)
$n_i$ relative field factor of the microscopic magnetic field at the position of the detection region produced by the magnetized structure i (dimensionless)
$\chi_i$ volume susceptibility of the i$^{th}$ structure (dimensionless)
$D_d$ relative field factor of the microscopic magnetic field at the position of the detection region produced by the magnetized detector liquid (dimensionless)
$\chi_d$ volume susceptibility of the detector liquid (dimensionless)

Thermally induced drifts of the field probe frequency are caused by two processes:
(i) The temperature dependence of the chemical shift δ is caused by a temperature dependent change in the electronic environment of the nucleus. Especially when strong intermolecular interactions are present (e.g. hydrogen bridge bonding in water), the temperature dependence can be very pronounced (10.3 ppb/K, see Hindman1966) and is used to conduct NMR-thermometry, see Ishihara1995). The presence of paramagnetic substances can lead to an additional, temperature-dependent chemical shift (complex formation and hyperfine shifts, see e.g. Chu1990).
(ii) Temperature dependent susceptibility changes originate from various physical effects. For diamagnetic substances (Langevin and Landau diamagnetism), the molar susceptibility $\chi_m$ is independent of temperature and only material density changes $n_0(T)$ affect the relevant volume susceptibility $\chi = \chi_m n_0$. Paramagnetic species can have both, temperature independent (Pauli and Van-Vleck paramagnetism) and temperature dependent (Langevin paramagnetism) contributions. The temperature dependence of the latter originate from the Boltzmann statistics of the net polarization of the magnetic moments in an external field. It leads to a 1/T-dependence of the molar susceptibility (Curie-Law). For small temperature changes δT, it can be linearized as $$\chi_m(T_0 + \delta T) = \chi_m(T_0) - \chi_m(T_0) \frac{\delta T}{T_0} \quad (2)$$

Density changes will also change the volume susceptibility but are in general negligible compared to the Curie-dependence.

Temperature Dependence of the Resonance Frequency of an MR Field Probe

In the neighborhood of a given temperature $T_0$ the resonance frequency is given by $$\omega'(T_0) := \frac{\partial \omega}{\partial T}(T_0) = \gamma B_0 (\underbrace{\Sigma_i n_i \chi_i'(T_0) + D_d \chi_d'(T_0)}_{\text{BMS: bulk magnetic susceptibility shift}} + \underbrace{\delta'(T_0)}_{\text{chemical shift}})$$

wherein:
γ gyromagnetic ratio of the MR nucleus under study (units: rad s$^{-1}$ T$^{-1}$)
$B_0$ applied magnetic field (units: T)
$n_i$ relative field factor of the microscopic field at the position of the detection region produced by the magnetized structure i in the field $B_0$ (dimensionless)

$$\chi_i'(T_0) := \frac{\partial \chi_i}{\partial T}(T_0)$$

temperature dependence of the volume susceptibility of the i$^{th}$ structure at temperature $T_0$ (units: K$^{-1}$)
$D_d$ relative field factor of the microscopic magnetic field at the position of the detection region produced by the magnetized detector liquid (dimensionless)

$$\chi_d'(T_0) := \frac{\partial \chi_d}{\partial T}(T_0)$$

total temperature dependence of the volume susceptibility of the detector liquid, including effects from the solvent and the dopant and of any added stabilizing substance, at temperature $T_0$ (units: K$^{-1}$)

$$\chi_d'(T_0) := \frac{\partial \chi_d}{\partial T}(T_0) = \frac{\partial \chi_{solvent}}{\partial T}(T_0) - \sum_j c_j \chi_{m,j} T_0^{-1}$$

$c_j$ concentration of the j$^{th}$ dopant (units: mol m$^{-3}$)
$\chi_{m,j}$ apparent molar paramagnetic susceptibility of the j$^{th}$ dopant dissolved in the detector liquid (units: mol$^{-1}$ m$^3$)

$$\delta'(T_0) := \frac{\partial \delta}{\partial T}(T_0)$$

temperature dependence of the total chemical shift of the resonance under study including potential effects from the dopants (temperature dependent complex formation (cf) and hyperfine shift (HS) (see Chu1990)) at temperature $T_0$.

$$\frac{\partial \delta}{\partial T} = \frac{\partial \delta_{solvent}}{\partial T} + \frac{\partial \Delta_{HS}}{\partial T} + \frac{\partial \Delta_{cf}}{\partial T}$$

Hence, the temperature dependence of the probe's precession frequency can be zeroed by balancing all the involved terms through an adjustment of their relative field factors and susceptibilities.

The optimal concentrations to obtain a thermally compensated NMR field probe are found by zeroing the following expression (for $T=T_0$):

$$\frac{\partial \omega}{\partial T} = \gamma B_0 \left( \sum_i n_i \chi'_i + D_d \chi'_d - \right.$$

$$\left. D_d \sum_j c_j \chi_{m,j} T_0^{-1} + \delta'_{solvent} + \sum_k \left( \frac{\partial \Delta_{HS,k}(c_k)}{\partial T} + \frac{\partial \Delta_{cf,k}(c_k)}{\partial T} \right) \right)$$

Case 1: Single Dopant with Negligible Temperature Dependence of $\Delta_{cf}$ and $\Delta_{HS}$ $$c = \frac{\Sigma_i n_i \chi'_i + D_d \chi'_{solvent} + \delta'_{solvent}}{D_d \chi_m T_0^{-1}}$$

$$\rightarrow R_1 = R_{1,solvent} + r_1 c$$

Case 2: Two Dopants with Negligible Temperature Dependence of $\Delta_{cf}$ and $\Delta_{HS}$ By using two paramagnetic dopants with different molar susceptibility and relaxivity a T-compensated NMR field probe with predefined relaxation rate $R_1$ (within a certain range) can be constructed.

The choice of the desired probe relaxation rate $R_1$ sets the values for the concentrations $$c_1 = \frac{(\Sigma_i n_i \chi'_i + D_d \chi'_{solvent} + \delta'_{solvent}) r_{1,2} T_0 - D_d \chi_{m,2}(R_1 - R_{1,solvent})}{D_d(\chi_{m,1} r_{1,2} - \chi_{m,2} r_{1,1})}$$

$$c_2 = \frac{(\Sigma_i n_i \chi'_i + D_d \chi'_{solvent} + \delta'_{solvent}) r_{1,1} T_0 - D_d \chi_{m,1}(R_1 - R_{1,solvent})}{D_d(\chi_{m,2} r_{1,1} - \chi_{m,1} r_{1,2})}$$

$r_{1,i}$ longitudinal relaxivity of the $i^{th}$ dopant (units: Hz mol$^{-1}$ m$^3$)

$R_{1,solvent}$ longitudinal relaxation rate of the solvent (units: Hz)

$R_1$ target probe relaxation rate (units: Hz)

Figure 1A:
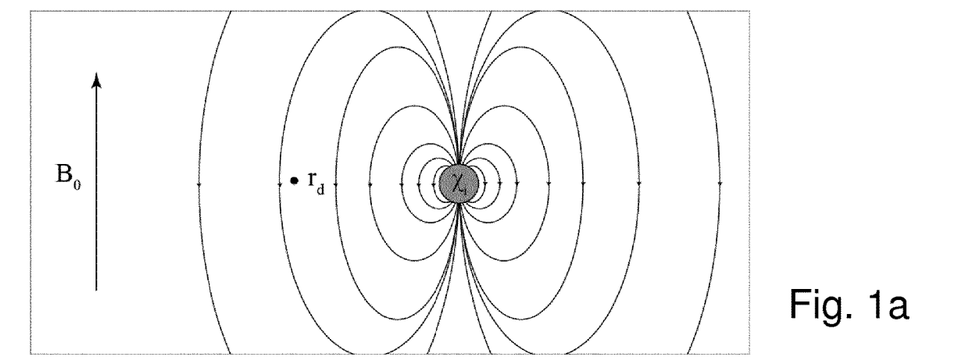
FIG. 1a shows a schematic view of the magnetic field (shown in magnetic field lines) in the vicinity of a detector liquid droplet produced by a structure with volume susceptibility $\chi_i$.

Definition of Relative Field Factors $n_i$ is a dimensionless factor, defined by the ratio between the additional microscopic magnetic field strength $\Delta B_{m,i}$ at the position $r_d$ of the s detection region produced by structure i with volume susceptibility $\chi_i$ magnetized by the magnetic field $B_0$, and ($\chi_i B_0$):

$$n_i := \frac{\Delta B_{m,i}}{B_0 \chi_i}$$

-continued $$B_m(r_d) = B_0 + \Delta B_{m,i}(B_0, \chi_i, r_d) := B_0 + n_i(r_d) B_0 \chi_i$$

(see FIG. 1a)

Figure 1B:
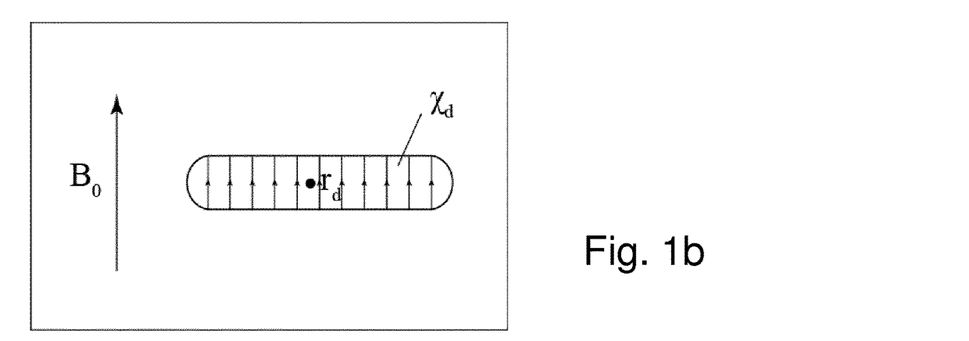
FIG. 1b shows a schematic view of the situation within the detector liquid of susceptibility $\chi_d$.

$D_d$ is a dimensionless factor, defined by the ratio between the additional microscopic magnetic field strength $\Delta B_{m,d}$ at the position $r_d$ of the detection region produced by the detector liquid with susceptibility $\chi_d$ magnetized by the magnetic field $B_0$, and ($\chi_d B_0$):

$$n_d := \frac{\Delta B_{m,d}}{B_0 \chi_d}$$

$$B_m(r_d) = B_0 + \Delta B_{m,d}(B_0, \chi_d, r_d) := B_0 + D_d(r_d) B_0 \chi_d$$

(see FIG. 1b)

Here "microscopic" describes the magnetic field $B_m = \mu_0 H_m$ as it is seen by the nuclear spin. A detailed description of macroscopic and microscopic magnetic fields in the context of NMR can be found in (see Vlassenbroek1996).

A numerical method to calculate the $B_m$-fields is shown e.g. in Marques2005

BRIEF DESCRIPTION OF THE DRAWINGS

The above mentioned and other features and objects of this invention and the manner of achieving them will become more apparent and this invention itself will be better understood by reference to the following description of embodiments of this invention taken in conjunction with the accompanying drawings, wherein.

DETAILED DESCRIPTION OF THE PREFERRED EMBODIMENTS OF THE INVENTION

Figure 2:
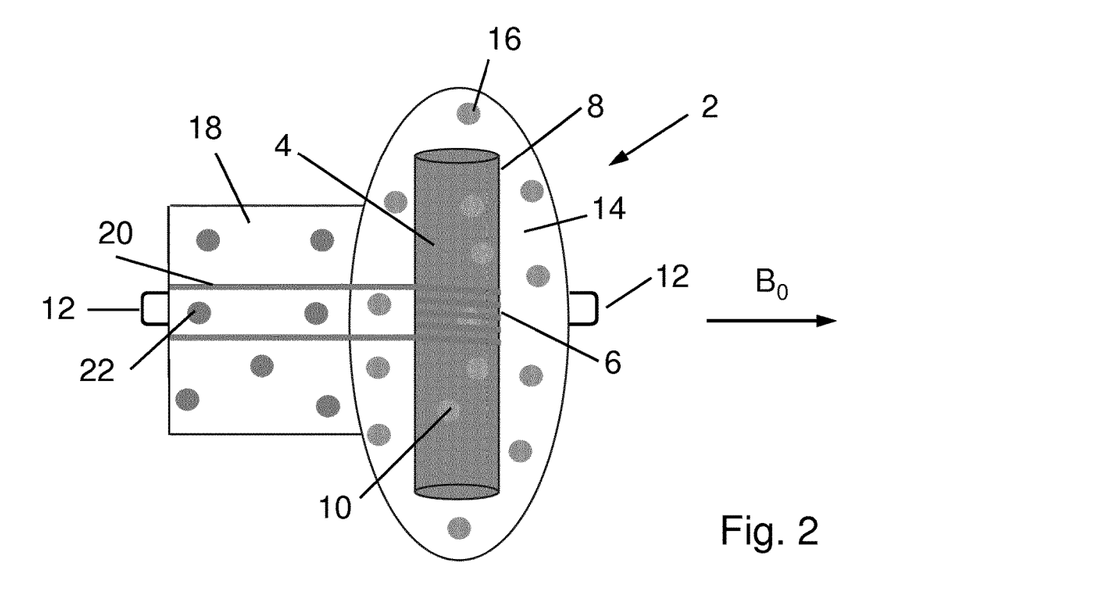
FIG. 2 shows a magnetic field probe, in a sectional view.
Figure 3:
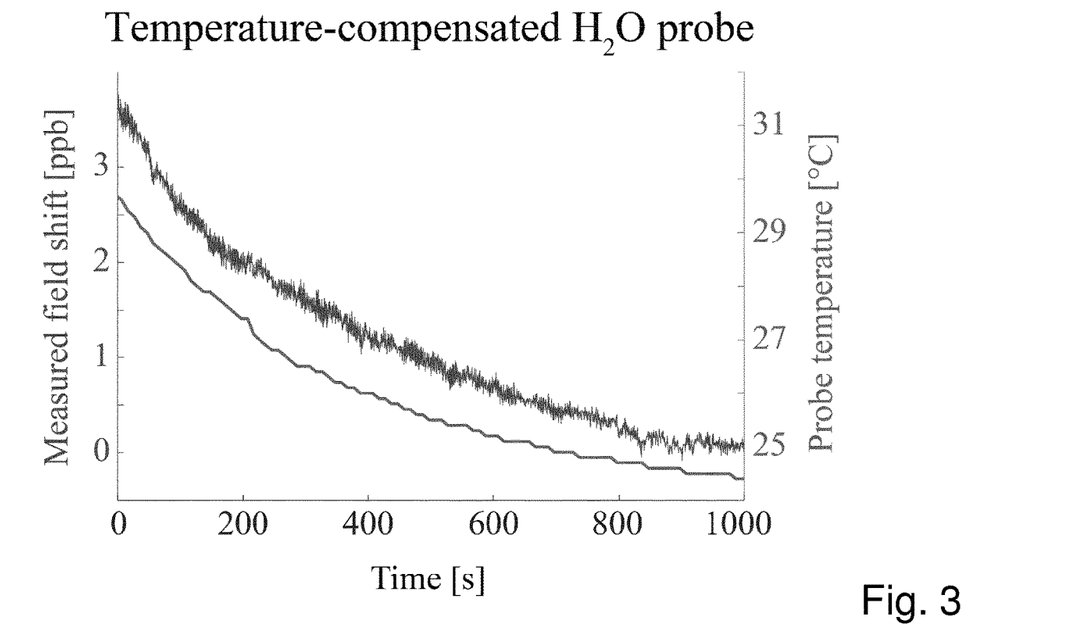
FIG. 3 shows the measured relative field shift $\Delta B/B_0$ of a T-compensated $H_2O$ NMR field probe during cool-down in the MR scanner ($B_0$=3 T). 37.7 mM $Dy(NO_3)_3$ was used as paramagnetic dopant.
Figure 4:
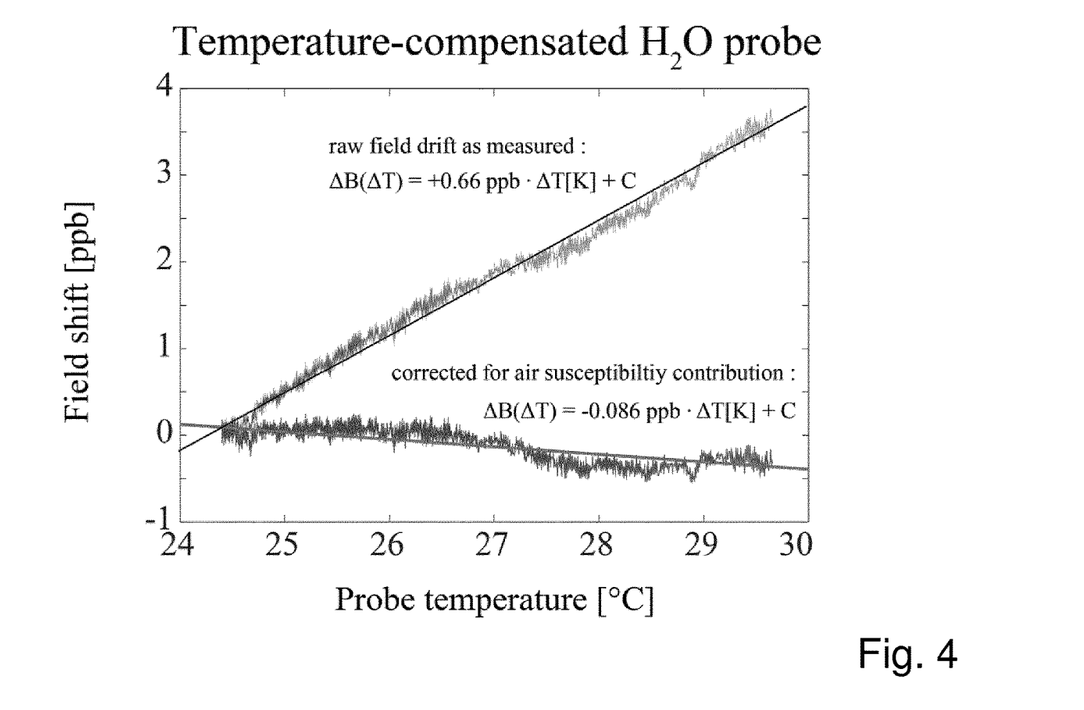
FIG. 4 shows the relative field shift $\Delta B/B_0$ of a T-compensated $H_2O$ NMR field probe (37.7 mM $Dy(NO_3)_3$ doping) as a function of probe temperature. When the experiment is performed in hot air, the susceptibility effect of the air temperature on the measured field must be taken into account, yielding a net T-dependence of the measured field in vacuum of $$\left| \frac{\Delta B/B_0}{\Delta T} \right| = \left| \frac{\Delta \omega / \omega_0}{\Delta T} \right| < 0.1 \text{ ppb/K}.$$
Figure 5:
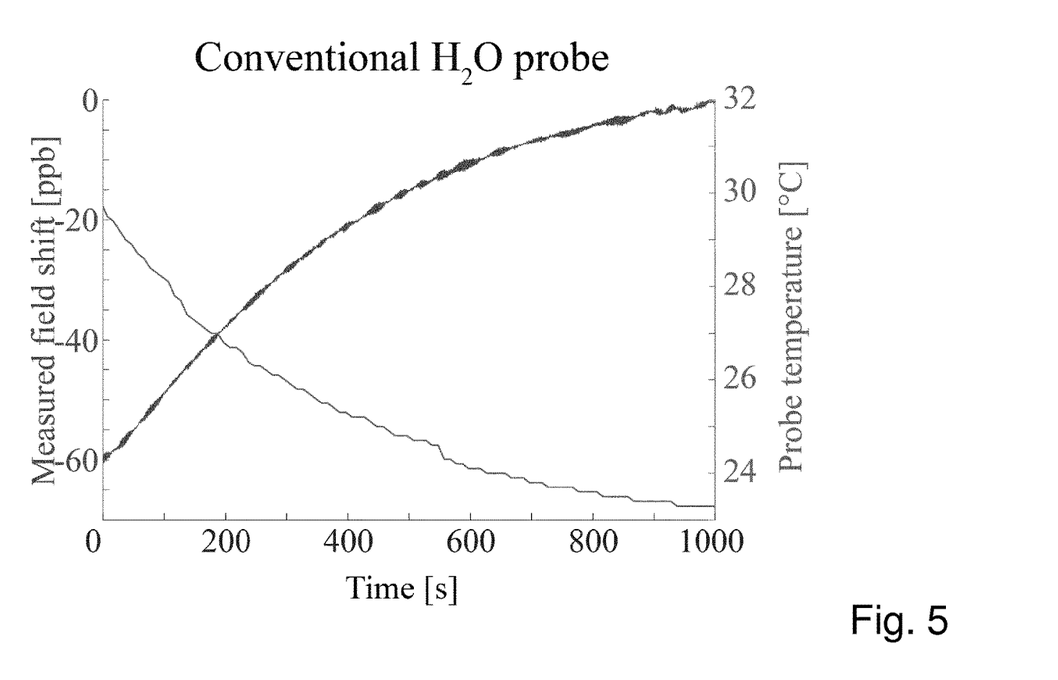
FIG. 5 shows the measured relative field shift $\Delta B/B_0$ of a conventional $H_2O$ NMR field probe (25 mM $CuSO_4$ doping) during cool-down in the MR scanner ($B_0$=3 T).
Figure 6:
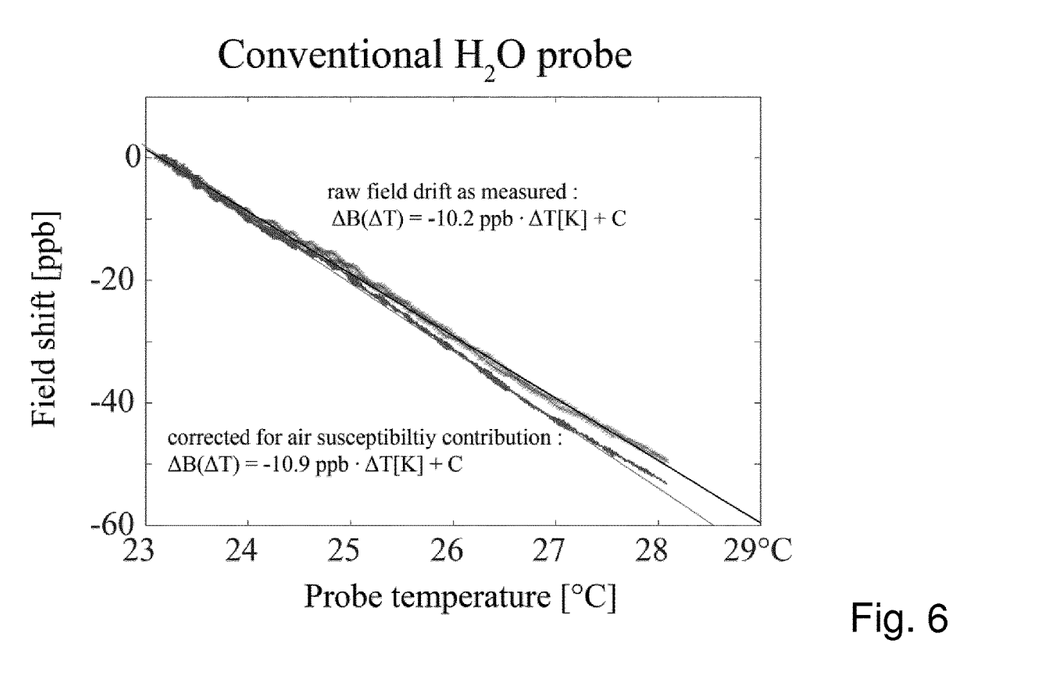
FIG. 6 shows the relative field shift $\Delta B/B_0$ of a conventional $H_2O$ NMR field probe (25 mM $CuSO_4$ doping) as a function of probe temperature. The T-dependence of the field measurement is $$\left|\frac{\Delta B/B_0}{\Delta T}\right| = \left|\frac{\Delta\omega/\omega_0}{\Delta T}\right| > 10 \ ppb/K.$$

As can be seen from FIG. 2, a magnetic field probe 2 for magnetic resonance applications comprises a detector liquid 4, an electrically conductive structure 6 surrounding the detector liquid for receiving therefrom a magnetic resonance signal; and a container 8 containing the detector liquid. The detector liquid contains paramagnetic dopant means 10 dissolved therein. Moreover, the field probe has orientation means 12 for orienting the field probe in relation to a reference direction in the laboratory system. In the particular example shown, the alignment means 12 are configured as axially mounted stubs oriented parallel to the direction of external magnetic field $B_0$.

The magnetic field probe 2 further comprises a solid jacket 14 encasing the detector liquid 4, container 8 and the conductive structure 6. Advantageously, the solid jacket is made of a hardened two-component epoxy system containing a paramagnetic agent 16 dissolved therein. The concentration of the paramagnetic agent can be chosen such that the jacket has a magnetic susceptibility that is substantially identical to the magnetic susceptibility of the conductive structure. Also shown in FIG. 2 is a further jacket 18 surrounding electrical leads 20 that connect the conductive structure 6 with an electronic module (not shown) for pulsed excitation of an NMR transition of the detector liquid and/or for receiving a corresponding NMR signal induced by the pulsed excitation. In the example shown, the further jacket 18 comprises a further paramagnetic agent 22 whose concentration can be chosen such that the further jacket has a magnetic susceptibility that is substantially identical to the magnetic susceptibility of air.

Example: Sub-ppb/K Temperature Drift of NMR Field Probes Using Intrinsic Magnetostatic Compensation Preliminary Remarks All the relevant contributions have been identified by means of numerical simulations or experiments, and the corresponding relative field factors ($n_i$ and D) were calculated (see Marques2005). The respective susceptibility changes were estimated from eq. 2.

TABLE 1

| Structure | $n_i$, D | $\chi'/\delta'$ [ppb/K] (T = 295K) | Physics |
|---|---|---|---|
| $\chi$-matched epoxy of probe neck | 0.0475 | −34.4 | Curie behavior of $\chi$-matching agent |
| $\chi$ of detector liquid ($H_2O$) excl. relaxation agent | −0.167 | −1.253 (Davis1998) | H-bridge bonding and density changes |
| relaxation agent in detector liquid | −0.167 | $-\dfrac{\chi_{m,1}(T_0)}{295K}$ | Curie behavior |
| chemical shift of detector liquid ($H_2O$) | 1 | −10.3 (Hindman1966) | H-bridge bonding |

As can be seen from Table 1, for the given geometry, all the temperature dependences come with a negative sign and even a partial compensation of the effects can only happen due to the negative sign of the relative field factor of the detector liquid. Accordingly, the amount of bulk susceptibility shift induced by the paramagnetic relaxation agent dissolved in the detector liquid is the only parameter where leverage can be applied. Solving for $\chi_{m,1}(T_0)$, a required susceptibility shift of +21 ppm induced by the relaxation agent is needed to cancel all the competing effects. For commonly used relaxation agents (e.g. $Cu^{2+}$ or $Gd^{3+}$ salts) this would lead to relaxation times (<1 ms) far below useful levels for conventional "long-lived" (required signal lifetimes of tens of milliseconds) monitoring applications. Instead $Dy^{3+}$ was used; compared to its magnetic moment, $Dy^{3+}$ is a rather ineffective relaxation agent. The optimal concentration is 37.7 mM of $Dy(NO_3)_3 \cdot 5H_2O$ in $H_2O$.

Results

Five temperature stabilized NMR field probes were constructed as described above. Their behavior under thermal changes was measured in a 3 T whole human MR scanner (Philip Healthcare, the Netherlands). The test-probes were mounted in an insulation box (styro-foam) and heated by adding a block of heated aluminum. After removal of the Al-block, the field probes were left for about one minute to settle in a thermal equilibrium. During the following slow cool down (it took about 20 min to reach ambient temperature) the resonance frequency of the field probes were measured repeatedly. $B_0$ and clock drifts were monitored using an additional set of four thermally isolated field probes located around the insulation box (watchdog).

The temperature of the test-field probe, as well as of the watchdog probes were logged with four fluoroptic temperature sensors. It is to be noticed, that the air contained within the insulation box is equally cooling down during the experiment. The effect of the associated susceptibility change (−2.59 ppb/K (Davis1998)) will corrupt the field measurement. However, knowing the relative field factor of the probe in air (=0.3 for an oblate ellipsoid of 20×13×16 mm), the contribution due to the changing air-magnetization can be quantified. FIGS. 3 to 6 show the measured temperature dependence of a temperature-compensated and a conventional field probe (25 mM $CuSO_4$ doping) and a linear regression of their drift for the corrected and the uncorrected data.

Discussion

A method to compensate for temperature-induced drifts of NMR-field probes was introduced and tested successfully. Compared to a conventional field probe, the T-dependence was reduced by more than two orders of magnitude. Although the T1 was slightly shorter than for conventional probes (45 vs 55 ms), the probe's $\xi=SNR\cdot\sqrt{BW}$ remained unaffected ($9\cdot10^4$ $\sqrt{Hz}$), and a thermal field measurement precision of 20 pT (0.006 ppb @ 3 T) was calculated. The presented solution does not require calibration or additional hardware and the field probe can be used without further constraints or limitations. So far, the suggested method was validated on the example of a $H_2O$-based proton probe field. However, the method is generally applicable and could be used to compensate probes with different detector substances as well, increasing the range of potential probe liquids. The availability of field probes that are immune to temperature variations enables field monitoring applications of yet higher accuracy and flexibility. Furthermore, the presented method could also be used to build temperature stabilized reference phantoms for other MR-applications.

REFERENCES

Chu1990 Chu, K. C.; Xu, Y.; Balschi, J. A. & Springer, C. S., Bulk Magnetic Susceptibility Shifts in NMR Studies of Compartmentalized Samples: Use of Paramagnetic Reagents. *Magnetic Resonance in Medicine*, 1990, 13, 239-262

Davis1998 Davis, R. S. Equation for the volume magnetic susceptibility of moist air. *Metrologia*, 1998, 35, 49-55

Hindman1966 Hindman, J. C. Proton Resonance Shift of Water in the Gas and Liquid States. *The Journal of Chemical Physics*, 1966, 44, 4582-4592

Ishihara1995 Ishihara et al., A precise and fast temperature mapping using water proton chemical shift. *Magnetic Resonance in Medicine*, 1995, 34, 814-823

Marques2005 Marques, J. & Bowtell, R. Application of a Fourier-Based Method for Rapid Calculation of Field Inhomogeneity Due to Spatial Variation of Magnetic Susceptibility. *Concepts in Magnetic Resonance Part B: Magnetic Resonance Engineering*, 2005, 25B, 65-78

Vlassenbroek1996 Vlassenbroek, A.; Jeener, J. & Broekaert, P. Macroscopic and Microscopic Fields in High-Resolution Liquid NMR. *Journal of Magnetic Resonance, Series A*, 1996, 118, 234-246

The invention claimed is:

1. A magnetic field probe, particularly for magnetic resonance applications, comprising:
    a detector liquid that exhibits a nuclear magnetic resonance (NMR) line characterized by a chemical shift $\delta$;
    an electrically conductive structure surrounding a detection region of the detector liquid for receiving therefrom a magnetic resonance signal; and
    a container containing the detector liquid;
    the detector liquid containing paramagnetic dopant means dissolved therein;
    said NMR transition having an observable resonance frequency $\omega$ when the field probe is placed in an external magnetic field $B_0$;
    the field probe having orientation means for orienting the field probe in relation to a reference direction of said external magnetic field;
characterized in that the concentration $c_D$ of said paramagnetic dopant means is selected in such manner that, when the field probe is placed into said external magnetic field and oriented in a predefined manner with respect to said external magnetic field at a given temperature $T_0$, a temperature dependence $\omega'(T_0)$ of said resonance frequency $\omega$ defined as $$\omega'(T_0) := \frac{\partial \omega}{\partial T}(T_0) = \gamma B_0 (\Sigma_i n_i \chi'_i(T_0) + D_d \chi'_d(T_0) + \delta'(T_0)) \quad (1)$$

wherein:
    $\gamma$ is the gyromagnetic ratio of the nucleus giving rise to said NMR line;
    i denotes any magnetized component of the probe, excluding the detector liquid;
    $n_i$ is the relative field factor of the microscopic magnetic field at the position of the detection region produced by the magnetized component i;
    $\chi'_i(T_0)$ is the temperature dependence of the volume susceptibility of component i at temperature $T_0$;
    $D_d$ is the relative field factor of the microscopic magnetic field at the position of the detection region produced by the magnetized detector liquid;
    $\chi'_t(c_D; T_0)$ is the total temperature dependence of the volume susceptibility of the detector liquid including dopant means at temperature $T_0$; and
    $\delta'(T_0)$ is the temperature dependence of the total chemical shift of the nuclear magnetic resonance under study
is substantially zero.

2. The magnetic field probe according to claim 1, wherein $\omega'(T_0)$ is substantially zero when the field probe is oriented in a further predefined manner with respect to said external magnetic field.

3. The magnetic field probe according to claim 1, wherein $\omega'(T_0)$ is substantially zero independently of the orientation with respect to said external magnetic field.

4. The magnetic field probe according to claim 1, wherein the paramagnetic dopant means consists of at least one paramagnetic ion species.

5. The magnetic field probe according to claim 1, wherein the detector liquid is water.

6. The magnetic field probe according to claim 4, wherein the paramagnetic dopant means are $Dy^{3+}$.

7. The magnetic field probe according to claim 4, wherein the paramagnetic dopant means are $Nd^{3+}$.

8. The magnetic field probe according to claim 1, wherein the paramagnetic dopant means comprise at least two paramagnetic species.

9. The magnetic field probe according to claim 1, wherein the container has ellipsoidal geometry.

10. The magnetic field probe according to claim 1, further comprising a solid jacket encasing the detector liquid and the conductive structure, the solid jacket being made of a hardened two-component epoxy system containing a paramagnetic agent dissolved therein, the concentration $c_A$ of the paramagnetic agent being chosen such that the jacket has a magnetic susceptibility that is substantially identical to the magnetic susceptibility of the conductive structure.

11. The magnetic field probe according to claim 1, further comprising means for pulsed excitation of said NMR transition and means for receiving a corresponding NMR signal induced by said pulsed excitation.

12. The magnetic field probe according to claim 2, wherein the paramagnetic dopant means consists of at least one paramagnetic ion species.

13. The magnetic field probe according to claim 3, wherein the paramagnetic dopant means consists of at least one paramagnetic ion species.

14. The magnetic field probe according to claim 2, wherein the detector liquid is water.

15. The magnetic field probe according to claim 3, wherein the detector liquid is water.

16. The magnetic field probe according to claim 4, wherein the detector liquid is water.

17. The magnetic field probe according to claim 5, wherein the paramagnetic dopant means are $Dy^{3+}$.

18. The magnetic field probe according to claim 5, wherein the paramagnetic dopant means are $Nd^{3+}$.

19. The magnetic field probe according to claim 2, wherein the paramagnetic dopant means comprise at least two paramagnetic species.

20. The magnetic field probe according to claim 3, wherein the paramagnetic dopant means comprise at least two paramagnetic species.

* * * * *

UNITED STATES PATENT AND TRADEMARK OFFICE
CERTIFICATE OF CORRECTION

Page 1 of 1

PATENT NO. : 10,564,230 B2
APPLICATION NO. : 15/573886
DATED : February 18, 2020
INVENTOR(S) : Simon Gross and Christoph Barmet It is certified that error appears in the above-identified patent and that said Letters Patent is hereby corrected as shown below:

In the Claims

Column 12, Line 4, delete "X't" and insert --X'd--

Signed and Sealed this
Seventh Day of July, 2020

Andrei Iancu
*Director of the United States Patent and Trademark Office*